United States Patent
Sladen

(10) Patent No.: US 7,952,639 B2
(45) Date of Patent: May 31, 2011

(54) PIEZOELECTRIC ACTUATOR ELEMENT FOR MICROMOVEMENT

(75) Inventor: Peter Sladen, Winchester Hants (GB)

(73) Assignee: Nokia Corporation, Espoo (FI)

( * ) Notice: Subject to any disclaimer, the term of this patent is extended or adjusted under 35 U.S.C. 154(b) by 694 days.

(21) Appl. No.: 11/884,305

(22) PCT Filed: Feb. 15, 2005

(86) PCT No.: PCT/FI2005/000101
§ 371 (c)(1),
(2), (4) Date: May 6, 2008

(87) PCT Pub. No.: WO2006/087408
PCT Pub. Date: Aug. 24, 2006

(65) Prior Publication Data
US 2009/0046194 A1    Feb. 19, 2009

(51) Int. Cl.
*H04N 5/225*    (2006.01)
*H04N 5/232*    (2006.01)
*G02B 13/16*    (2006.01)
*G02B 7/02*    (2006.01)
*G03B 13/00*    (2006.01)

(52) U.S. Cl. ........ 348/357; 348/335; 348/374; 359/814; 359/824

(58) Field of Classification Search ............... 348/357, 348/374, 335, 340; 359/824, 813
See application file for complete search history.

(56) References Cited

U.S. PATENT DOCUMENTS

| 4,291,958 | A  | * | 9/1981  | Frank et al. | 396/133 |
| 4,303,324 | A  | * | 12/1981 | Marcus | 396/133 |
| 4,685,767 | A  | * | 8/1987  | Ueshiba et al. | 359/824 |
| 5,734,490 | A  |   | 3/1998  | Rabarot et al. | |
| 6,710,950 | B2 | * | 3/2004  | Rouvinen et al. | 359/824 |
| 6,943,966 | B2 | * | 9/2005  | Konno | 359/819 |
| 7,068,930 | B2 | * | 6/2006  | McKevitt et al. | 396/79 |
| 7,170,665 | B2 | * | 1/2007  | Kaneko et al. | 359/290 |
| 7,193,794 | B2 | * | 3/2007  | Beck et al. | 359/822 |
| 7,251,087 | B2 | * | 7/2007  | Yamashita et al. | 359/822 |
| 7,333,724 | B2 | * | 2/2008  | Chen | 396/133 |
| 7,486,454 | B2 | * | 2/2009  | Chen et al. | 359/824 |

(Continued)

FOREIGN PATENT DOCUMENTS
EP    0 154 473 A    9/1985
(Continued)

OTHER PUBLICATIONS

European Office Action for application No. 05 708 181.2-2222 dated Jun. 5, 2009.

*Primary Examiner* — John M Villecco
(74) *Attorney, Agent, or Firm* — Squire, Sanders & Dempsey (US) LLP

(57) ABSTRACT

An actuator element comprises at least two actuator arms. Each of the at least two actuator arms is fixed to a first mount part at a first end of the actuator arm and to a second mount part at a second end of the actuator arm. The at least two actuator arms are configured to cause moving of the first mount part and the second mount part in respect of each other by application of an electric field to the at least two actuator arms. A lens element may comprise the actuator element and a lens mounted on the first mount part. An electronic device may comprise the actuator element or the lens element.

11 Claims, 3 Drawing Sheets

U.S. PATENT DOCUMENTS

| | | | |
|---|---|---|---|
| 7,619,837 B2 * | 11/2009 | Choi et al. | 359/811 |
| 7,782,560 B2 * | 8/2010 | Huang et al. | 359/824 |
| 2003/0227559 A1 | 12/2003 | Rouvinen et al. | |
| 2006/0215283 A1 * | 9/2006 | Makii | 359/824 |
| 2009/0225453 A1 * | 9/2009 | Chang | 359/824 |
| 2010/0232043 A1 * | 9/2010 | Hishinuma | 359/824 |

FOREIGN PATENT DOCUMENTS

| | | |
|---|---|---|
| GB | 2375884 | 11/2002 |
| GB | 2376592 | 12/2002 |
| JP | 63021615 | 1/1988 |
| JP | 7231080 | 8/1995 |
| JP | 10301013 A * | 11/1998 |
| JP | 11090867 | 4/1999 |

\* cited by examiner

PIEZOELECTRIC ACTUATOR ELEMENT FOR MICROMOVEMENT

FIELD OF THE INVENTION

The invention relates to actuators, in particular to an actuator element for optical systems, and to a lens element. The present invention also relates to electronic devices, such as communication devices, comprising such an actuator element or a lens element.

BACKGROUND OF THE INVENTION

An electronic device may be provided with camera means. Such electronic devices may comprise mobile communication devices or terminals, such as user equipment (UE), a mobile station (MS), a cellular phone, a personal digital assistant (PDA) and so on, or other electronic devices, such as a digital camera, a camcorder or a laptop computer.

Camera means are typically provided with a lens element with an adjustable focus and zoom, which may call for an automated and motorised drive of the focus and zoom. Camera means for small devices, such as portable or mobile devices, may need to be very small in size. In particular, very small camera means may be needed for mobile communication devices, in which camera means is only one of a plurality of functions.

Movement resolution and movement range may set requirements for the system. For example, the movement resolution for focus may be very fine, figures of less than 100 μm have been discussed. However, the movement range of the focus may be quite small, for example in the region of maximum 0.5 mm. Zoom typically has very different requirements, such as less accuracy and much more movement range, such as several millimetres.

Patent Application US 2003/0227559 A1 relates to a mechanism for moving lens elements of an electronic camera. The mechanism comprises a support tube and a lens tube, which holds a lens and is mounted coaxially within the support tube. The lens tube is adjustable. Piezoelectric elements are mounted on a flexible circuit board on an outer periphery of the support tube. A piezoelectric element is in a form of a beam and has an attachment lever extending outward transverse to the longitudinal axis of the beam. The piezoelectric element is excited to cause the attachment lever to engage the lens tube and adjust an axial position of the lens tube.

Patent Application WO 2004/047192 relates to an electroactive actuator comprising layers of electro-active material and electrode layers for activation of the electro-active material. The electro-active actuator is a curved strip and has at least one flat portion for providing contact terminal for electrodes.

Patent Application WO 2004/095596 relates to a device comprising a plurality of electro-active benders in an arrangement in which the displacements of individual benders, on activation, contribute to an overall, relative displacement between a proximal end and a distal end of the device.

Patent Application WO 03/061276 relates to a camera with an adjustable focus. The camera comprises a fixed lens, a sensor and a piezo-element positioned under the sensor for displacing the sensor.

In above systems, movement may be limited, in particular for piezoelectric materials, which typically move in a range of approximately three percent of their width. Therefore, for a thin block of material, the movement may be insufficient. Furthermore, solutions may require too much space for implementing in a small device, such as a portable device. Or, solutions may require intricate hand assembly.

Therefore, alternative solutions of an adjustable lens element may be needed. It might be desired to provide camera means with small lens element yet having a sufficient movement range and resolution. Such a lens element may be usable in electronic devices, in particular in portable or mobile electronic devices.

SUMMARY OF THE INVENTION

In accordance with an aspect of the invention, there is provided an actuator element comprising at least two actuator arms. Each of the at least two actuator arms is fixed to a first mount part at a first end of the actuator arm and to a second mount part at a second end of the actuator arm. The at least two actuator arms are configured to cause moving of the first mount part and the second mount part in respect of each other by application of an electric field to the at least two actuator arms.

In an embodiment, the at least two actuator arms are of piezoelectric material.

In an embodiment, a first part of the at least two actuator arms may be configured to form one of a curvature upwards and a curvature downwards caused by a first electric field applied to the first part of the at least two actuator arms and a second part of the at least two actuator arms may be configured to form the other of the curvature upwards and the curvature downwards caused by a second electric field applied to the remaining of the at least two actuator arms. In an embodiment, the second electric field may be opposite to the first electric field. In an embodiment, the second electric field may be zero volts.

In an embodiment, the at least two actuator arms may be configured to form one of a curvature upwards and a curvature downwards caused by the electric field applied to the at least two actuator arms. In an embodiment, the at least two actuator arms may be provided with a corrugation at, at least, one of the first end and the second end.

In an embodiment, the at least two actuator arms may extend on a periphery of the first mount part and are bordered by the second mount part. In an embodiment, the at least two actuator arms may extend circularly around the first mount part and are circularly surrounded by the second mount part.

In an embodiment, the first mount part and the second mount part form a single piece with the at least two actuator arms, wherein the at least two actuator arms are separated from the first mount part and from the second mount part by means of slots.

In an embodiment, the at least two actuator arms may have a spiral shape.

In an embodiment, the actuator element may further comprise a lens mounted on the first mount part.

In accordance with a further aspect of the invention, there is provided a lens element, which may comprise the actuator element and a lens mounted on the first mount part.

In accordance with a further aspect of the invention, there is provided an electronic device, which may comprise the actuator element or the lens element. The electronic device may be user equipment, a mobile station, a cellular phone, a personal digital assistant, a digital camera, a camcorder and a laptop computer.

BRIEF DESCRIPTION OF THE DRAWINGS

The invention will now be described in further detail, by way of example only, with reference to the following examples and accompanying drawings, in which.

DETAILED DESCRIPTION OF PREFERRED EMBODIMENTS

Figure 1:
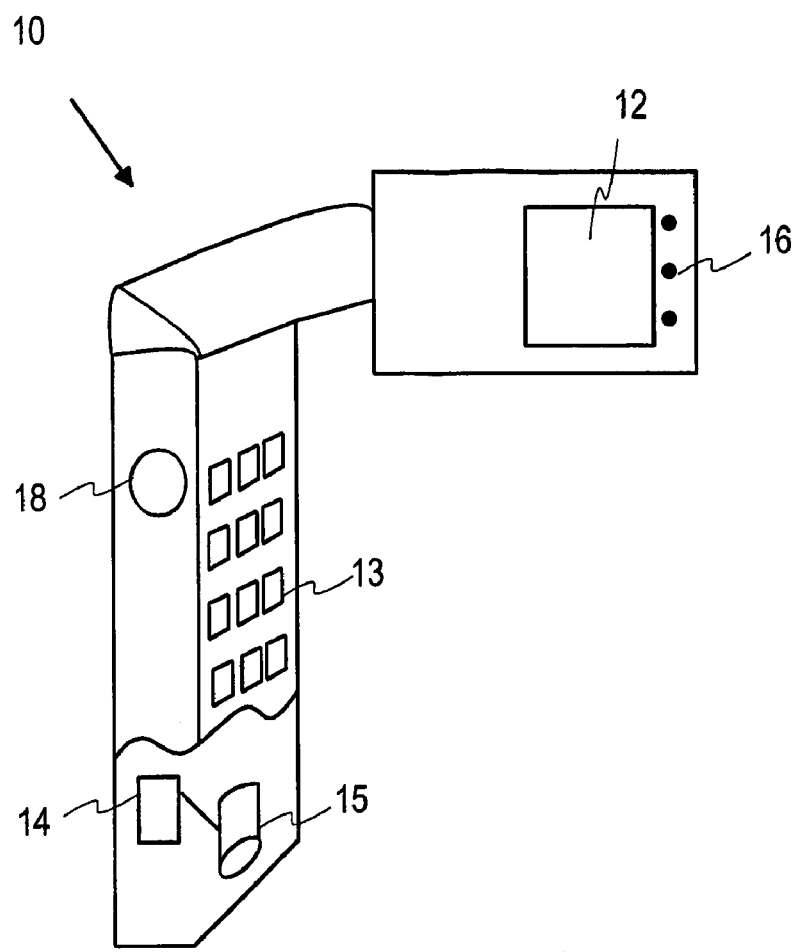
FIG. 1 shows an example of a communication device in which the embodiments of the invention may be implemented.

FIG. 1 shows an example of an electronic device 10 provided with a display 12 and control buttons 13. Furthermore, a processor entity 14, electrical memory means 15 and speaker means 16 are provided. Furthermore, camera means 18 are shown on a side of the communication device 10.

FIG. 1 shows only one exemplifying electronic device in which the embodiments of the invention may be implemented. The electronic device of FIG. 1 has a form of a communication device, more particularly a mobile station of two moving halves. It shall be appreciated that the type of the electronic device may differ substantially from what is shown in FIG. 1. In a case of a communication device, visible radio reception and transmission means, such as an antenna, may be arranged in an appropriate manner or radio reception and transmission means may be built in the casing of the communication device. The control buttons of any appropriate form may be positioned in an appropriate manner depending on the device type, size and use, for example. Also the form, type and position of the display and camera means, for example, may vary depending on the device type, size and use.

Electronic devices where embodiments of the invention may be implemented may comprise, but are not limited to, mobile communication devices or terminals, such as user equipment (UE), a mobile station (MS), a cellular phone, a personal digital assistant (PDA) and so on, or other electronic devices, such as a digital camera, a camcorder, a laptop computer, and any other electronic devices comprising camera means.

It has now been found that requirements set for focus and zoom in camera means, such as the movement resolution and range, might be met in an improved manner by means of a lens element comprising an actuator element using principles of piezoelectric or other electro-active effects, preferably in a form of a circular mounting for a lens.

The actuator element according to embodiments of the invention comprises at least two arms. In a preferred embodiment, the actuator element may comprise three arms. The arms may be formed by means of slots in the actuator element, when the actuator element comprises a first mount surrounded by the actuator arms and a second mount part extending around the actuator arms.

In an embodiment, the actuator arms may extend on a periphery of the first mount part and be bordered by the second mount part also in another form than circularly. For example, the actuator arms may extend as in a square or oblong form. The lens mount may be square or oblong, respectively, and provided with a circular hole, thereby providing corners to support the lens.

The actuator arms are made of electro-active material, preferably piezoelectric material. The actuator arms are configured to cause moving of the first mount part and the second mount part in respect of each other by application of an electric field, or a voltage, to the at least two actuator arms. The voltage may cause buckling to occur.

It may be advantageous to form the actuator element in a single part comprising the first mount and the second mount parts together with the actuator arms. The single part may be formed by punching a plating of a piezoelectric material. This may reduce hand assembly or mechanical connections of separated parts.

In an embodiment, the actuator element only comprises the actuator arms, which are fixed to a separate first mount part at a first end of the actuator arm and to a separate second mount part at a second end of the actuator arm. Also in this embodiment, the actuator arms are configured to cause moving of the first mount part and the second mount part in respect of each other by application of an electric field to the at least two actuator arms.

In an embodiment, length of the actuator arms may be altered. For example, the arms of the circular arrangement may be in a spiral shape. This may further improve the movement allowed for the lens mounted on the circular arrangement and may be suitable for optical zoom.

Embodiments of the invention may permit more movement than would normally occur with a simple block of piezoelectric material and may be suitable for auto focus. Embodiments of the invention may provide a volume efficient way of allowing movement of at least part of a lens assembly for auto focus and/or optical zoom.

It is seen that embodiments of the invention may provide advantages in optical systems, and in particular in small camera means provided in small electronic devices. Therefore, such optical systems are used as illustrating examples herein. However, it shall be appreciated that the actuator element according to embodiments of the invention may be used in any actuator implementations. Therefore, the invention is not limited to optical systems including a lens, but similar actuator elements may be used also for other adjusting purposes. Furthermore, similar actuator elements may be used also for other purposes, such as an audio transducer. In an exemplifying audio transducer embodiment, the center of the element might be solid, that is, having no hole for a lens or the like.

Electro-active materials comprise so-called piezoelectric materials, electrostrictive materials and piezoresistive materials. In this specification, reference is mainly made to piezoelectric materials. It shall be appreciated, however, that other electro-active materials may be usable for embodiments of the invention.

Piezoelectric materials, such as quartz ($SiO_2$) or barium titanate ($BaTiO_3$), are permanently polarized materials, which change dimensions when an electric field is applied to the material. Application of voltage creates mechanical stress and distortion in the piezoelectric material.

An optical system, such as camera means, may comprise one or more lenses. The optical system transmits an image from a subject to a sensor array as an optical signal. The sensor array converts the optical signal to a digital signal, which may be processed further. For focusing, the lens and the sensor are movable to each other. In the optical system having more than one lens, the lenses may be movable in relation to each other to provide focus and zoom capabilities.

Figure 2:
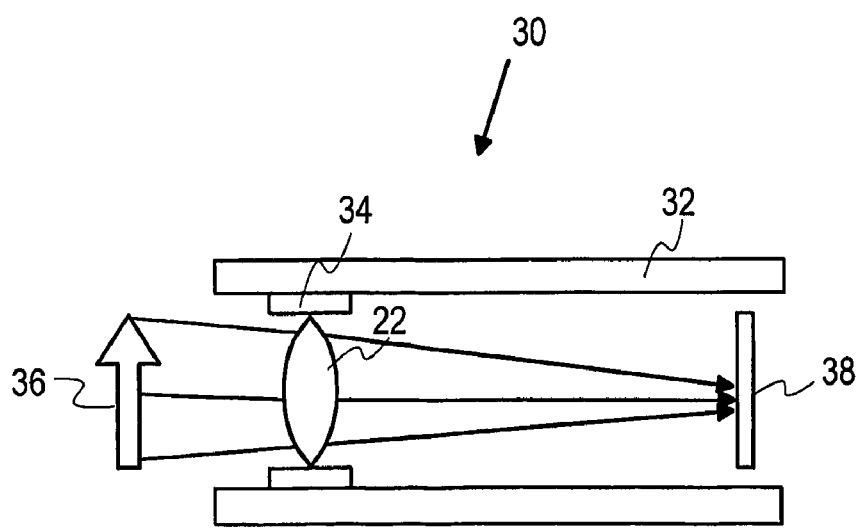
FIG. 2 shows a cross section view of an optical system in which the embodiments of the invention may be implemented.

FIG. 2 shows a simplified schematic view of a typical optical system suitable for camera means, for example. The optical system 30 comprises a support tube 32, a lens 22 mounted on a lens mount means 34. The lens 22 projects a focused image of a subject 36 on an image sensor 38, which is positioned at an image plane. The lens 22 should be movable in an axial direction to provide adjustment capability for the optical system.

Figure 3:
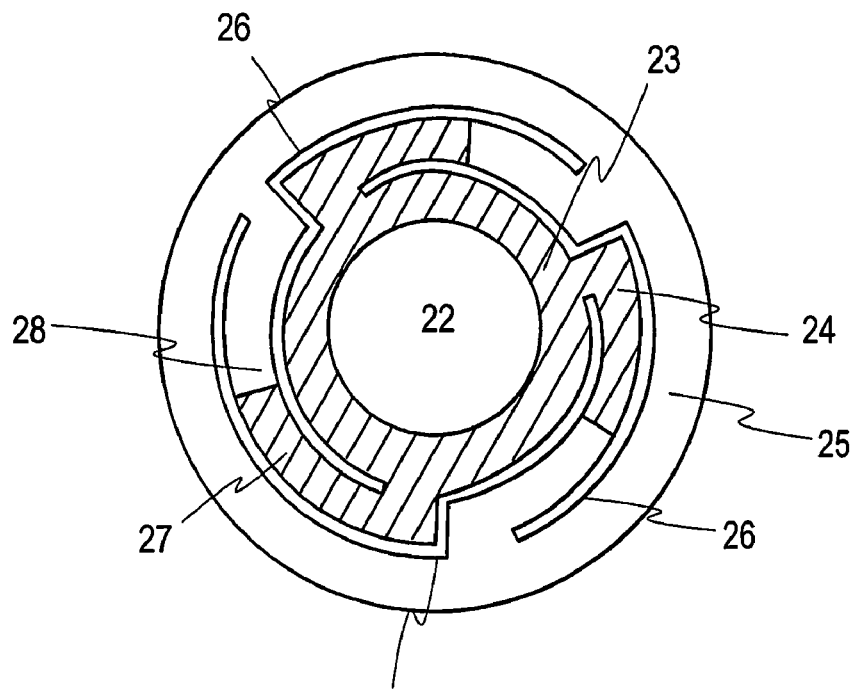
FIG. 3 shows a plan view of a lens arrangement according to an embodiment of the invention.

FIG. 3 shows a lens element 20 according to an embodiment of the invention. A circular arrangement may comprise a lens 22 mounted on a lens mount 23, an actuator part 24 and an assembly mount 25.

The lens 22 may be mounted on the lens mount 23 shown as an inner circle of the circular arrangement. The actuator part 24 comprising actuator arms is shown as a middle circle and the assembly mount 25 as an outer circle of circular arrangement. The lens mount 23 is joined to each actuator arm via a first connection at a first end of the actuator arm. The assembly mount 25 is joined to each actuator arm via a second connection at a second end of the actuator arm. The actuator part 24 is separated by slots 26 from the lens mount 23 and from the assembly mount 25 in the area between the first connection and the second connection as shown in FIG. 3. The lens mount 23 and the assembly mount 25 may be generally referred to as a mounting area. The lens element 20 has a metal substrate underneath, as will be explained referring to FIGS. 4 and 6 (the metal substrate not visible in FIG. 3).

A voltage differential may be caused between a first part 27 and a second part 28 of the actuator. In an embodiment, a first voltage is applied to one part of the lens element 20, for example the first part 27 filled with stripes in FIG. 3, and a second voltage, such as an opposite voltage, is applied to the rest of the lens element 20, for example the second part 28 shown non-filled in FIG. 3. In an embodiment, the first part 27 comprises about a half of each arm, namely the half next to the first connection joining the actuator arm to the lens mount 23. The second part 28 comprises the other about half of each actuator arm 24, namely the half next to the second connection joining the actuator arm to the assembly mount 25. The first voltage, which is applied to the first part 27, may be applied also to the lens mount 23. The second voltage, which is applied to the second part 28, may be applied also to the assembly mount 25.

In an embodiment, the first and second voltages may be different than opposite voltages. In an embodiment, one of the first voltage and the second voltage may be zero volts and the other of the first voltage and the second voltage may be positive or negative voltage.

Figure 4A:
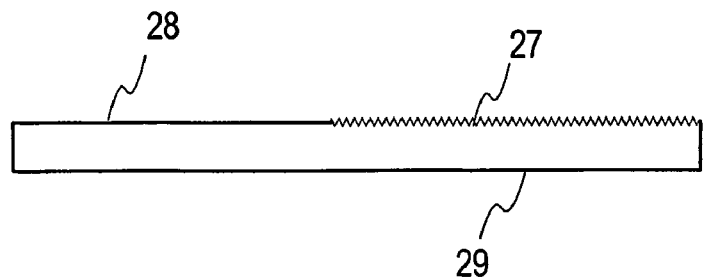
FIG. 4 shows a cross section view of an embodiment implemented in the embodiment of FIG. 3.
Figure 4B:
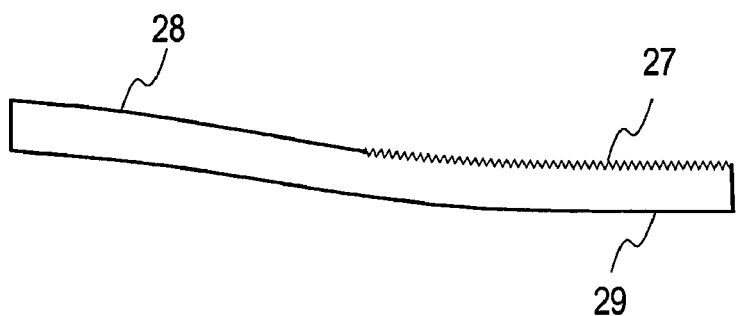

As different, such as opposite, voltages are applied to halves of the actuator arms of the actuator part 24, each actuator arm bends and causes the lens mount 23 and thereby the lens 22 to move forward or backward depending on polarities. The effect is further explained referring to FIG. 4, where FIG. 4a shows a cross section of one of the actuator arms without a voltage applied and FIG. 4b shows the actuator arm with opposite voltages applied to the first part 27 and the second part 28 with respect to the metal substrate 29 on which the lens element 20 is mounted. As can be seen in FIG. 4b, when opposite voltages are applied to the first part 27 and the second part 28, a curvature of the metal substrate 29 under the second part 28 is downwards and under the first part 27 is upwards. This may result in reduced stress at either the first or second end where the actuator part 24 is connected to the mounting area. The first end and the second end of each actuator arm are horizontal, lining up with an expected position of the mounting areas.

Figure 5:
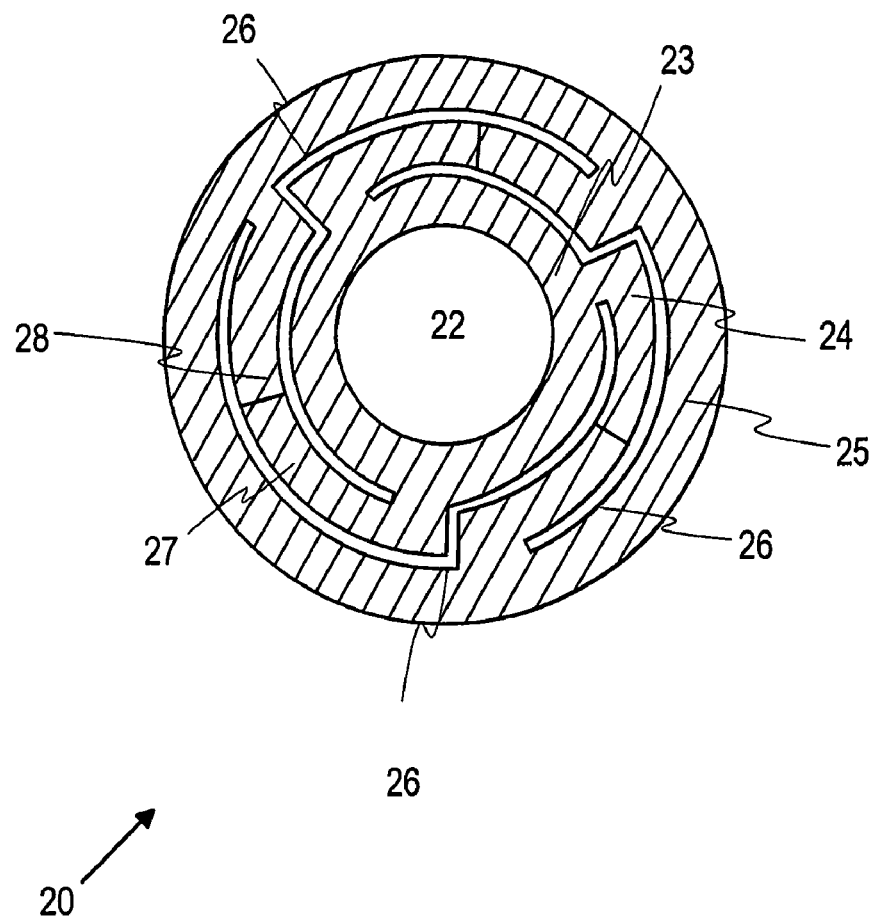
FIG. 5 shows a plan view of a lens arrangement according to a further embodiment of the invention.

In an embodiment shown in FIG. 5, the first voltage may be applied to the entire actuator part and the second voltage may be omitted. In this embodiment, the stress in the ends is caused by lens bending force and stiffness of the mounting areas. The stress changes direction at the ends where the actuator part is joined to one of the mounting areas. This may result in a reduced movement range compared to the above embodiment where different, for example opposite, voltages are applied to different parts 27, 28 of the actuator part 24.

Figure 6A:
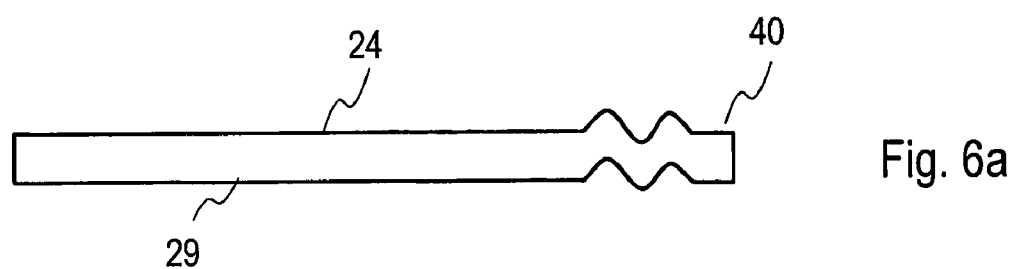
FIG. 6 shows a cross section view of an embodiment implemented in the embodiment of FIG. 5.
Figure 6B:
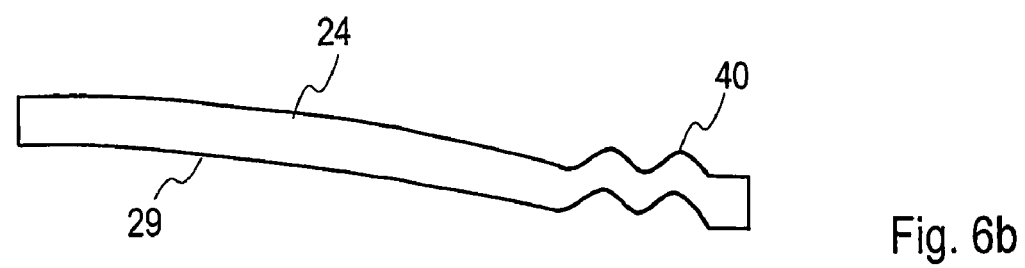

In a further embodiment shown in FIG. 6, the first voltage only is applied to the entire actuator part 24. FIG. 6a shows a cross section of one of the actuator arms without a voltage applied and FIG. 6b shows the actuator arm with the first voltage applied to the actuator arm with respect to the metal substrate 29 on which the lens element 20 is mounted. The actuator arm comprises a corrugation 40 at one of the first end and the second end. The corrugation may allow an extended length of a single biased lens element and give greater displacement. Applying only the first voltage to the actuator part 24 results in a single curvature of the actuator arm. In this embodiment, stresses caused by the single curvature are taken up by the corrugation 40.

In an embodiment, the actuator arms may be provided with the corrugation 40 and yet the voltage differential may be applied between the first part and the second part of the actuator arm by means of the first voltage and the second voltage.

In an exemplifying embodiment, lens diameter may be in a range of about 3 to 5 mm, mounts 23 and 25 may have a width of about 0.5 mm to 1 mm, and actuator width about 0.5 mm to 1 mm. Voltages used may be in a region of about 3V with some piezoelectric materials. Lens diameter may depend on camera module optical design, and so actuator sizes may be scaled to suite. However, size may be an essential feature and element widths may significantly vary, in particular may be significantly reduced, from the above figures. In some embodiments, a safety margin may need to be used. Voltage may also differ from the above figure. For example, a higher voltage may provide some benefits, e.g. linearity in movement, extended movement, thicker material for added strength, and so on.

Embodiments of the invention may provide a lens element for focus and zoom with simple assembly and low price. The element may be tough and drop resistant. Furthermore, the element may be fast moving and have a fine movement range. The element has no rubbing surfaces, which may extend life of the element compared to other focus types. Metal nature of the lens element, due to the metal substrate, can be utilised to enhance electro-magnetic compatibility by grounding the lens element.

In an embodiment, clamping of voltages may be needed to ensure that no voltages are generated despite of dropping a device provided with the lens element according to embodiments of the invention. In an embodiment, end stops may be needed above and below to prevent excessive movement if the device is dropped. In an embodiment, limited movement range associated with piezoelectric materials may need to be compensated by careful pre-alignment of the lens and the sensor. Getting fixed distance of movement for an instant, such as a few seconds, may require high voltages, such as higher than 3V. However, it might be desired to avoid using too high voltages, if possible. An example may comprise taking videos, where in focus for constant use may be desired. A possible solution may be to pre-align the lens to hyper-focal point, so that the farthest distance in focus is infinity. Then, for video use or where it is too dark to focus, focus movement may be omitted.

Although the invention has been described in the context of particular embodiments, various modifications are possible without departing from the scope and spirit of the invention as defined by the appended claims. It should be appreciated that whilst embodiments of the present invention have mainly been described in relation to mobile communication devices, embodiments of the present invention may be applicable to other types of electronic devices comprising camera means or in any types of optical systems requiring movement of, for example, a lens in function of a sensor. Furthermore, the invention is not limited to optical systems including a lens, but similar circular arrangements may be used also for other adjusting purposes.

The invention claimed is:

1. An actuator element comprising:
   at least two actuator arms;
   wherein each of the at least two actuator arms is fixed to a first mount part at a first end of the actuator arm and to a second mount part at a second end of the actuator arm;
   wherein the at least two actuator arms are configured to cause moving of the first mount part and the second mount part in respect of each other by application of an electric field to the at least two actuator arms; and
   comprising a lens mounted on the first mount part,
   wherein a first part of the at least two actuator arms is configured to form one of a curvature upwards and a curvature downwards caused by a first electric field applied to the first part of the at least two actuator arms and a second part of the least two actuator arms is configured to form the other of the curvature upwards and the curvature downwards caused by a second electric field applied to the second part of the at least two actuator arms, and
   wherein the at least two actuator arms are provided with a corrugation at, at least, one of the first end and the second end.

2. The actuator element according to claim 1, wherein the at least two actuator arms are of piezoelectric material.

3. The actuator element according to claim 1, wherein the second electric field is opposite to the first electric field.

4. The actuator element according to claim 1, wherein the second electric field is zero volts.

5. The actuator element according to claim 1, wherein the at least two actuator arms are configured to form one of a curvature upwards and a curvature downwards caused by the electric field applied to the at least two actuator arms.

6. The actuator element according to claim 1, wherein the at least two actuator arms extend on a periphery of the first mount part and are bordered by the second mount part.

7. The actuator element according to claim 6 wherein the at least two actuator arms extend circularly around the first mount part and are circularly surrounded by the second mount part.

8. The actuator element according to claim 1, wherein the first mount part and the second mount part form a single piece with the at least two actuator arms, wherein the at least two actuator arms are separated from the first mount part and from the second mount part by means of slots.

9. The actuator element according to claim 1, wherein the at least two actuator arms have a spiral shape.

10. An electronic device comprising an actuator element according to claim 1.

11. The electronic device according to claim 10, comprising one of user equipment, a mobile station, a cellular phone, a personal digital assistant, a digital camera, a camcorder and a laptop computer.

* * * * *